(12) United States Patent
Song et al.

(10) Patent No.: US 8,175,299 B2
(45) Date of Patent: May 8, 2012

(54) CONDENSER MICROPHONE MOUNTABLE ON MAIN PCB

(75) Inventors: Cheong-Dam Song, Seoul (KR); Eek-Joo Chung, Gimpo (KR); Jun Lim, Seoul (KR); Sung-Ho Park, Incheon (KR); Hyun-Ho Kim, Incheon (KR)

(73) Assignee: BSE Co., Ltd., Incheon (KR)

( * ) Notice: Subject to any disclaimer, the term of this patent is extended or adjusted under 35 U.S.C. 154(b) by 991 days.

(21) Appl. No.: 10/586,575

(22) PCT Filed: Oct. 1, 2004

(86) PCT No.: PCT/KR2004/002526
§ 371 (c)(1),
(2), (4) Date: Aug. 11, 2008

(87) PCT Pub. No.: WO2005/069681
PCT Pub. Date: Jul. 28, 2005

(65) Prior Publication Data
US 2009/0169034 A1    Jul. 2, 2009

(30) Foreign Application Priority Data
Jan. 20, 2004    (KR) .................. 10-2004-0004250

(51) Int. Cl.
H04R 25/00    (2006.01)
(52) U.S. Cl. ...................... 381/174; 381/175

(58) Field of Classification Search .......... 381/113, 381/174, 194, 175, 355; 367/181; 29/594
See application file for complete search history.

(56) References Cited

U.S. PATENT DOCUMENTS
6,108,432 A * 8/2000 Watanabe .............. 381/395
2005/0031150 A1 * 2/2005 Collins .................. 381/355

FOREIGN PATENT DOCUMENTS
| KR | 2002-0024122 | | 3/2002 |
| KR | 20020024122 A | * | 3/2002 |
| KR | 20-0332944 | | 11/2003 |
| KR | 200332944 | * | 11/2003 |

* cited by examiner

Primary Examiner — Curtis Kuntz
Assistant Examiner — Sunita Joshi
(74) Attorney, Agent, or Firm — Ladas & Parry LLP

(57) ABSTRACT

A condenser microphone mountable on a main PCB includes a cylinder-shaped case having opened and closed sides; a first metal ring inserted into the case; a disk-shaped back plate having a sound hole to be connected electrically to the case through the first metal ring; a spacer; an insulating ring to provide electrical insulation and mechanical support. A diaphragm is inserted into the insulating ring and faces the back plate while interposing the spacer between the diaphragm and the back plate. A second metal ring is connected electrically to the diaphragm and mechanically supports the diaphragm, and a PCB is mounted and forms with a sound hole. The PCB is connected to the back plate through the second metal ring and the case, and the PCB includes connection terminals.

6 Claims, 6 Drawing Sheets

US 8,175,299 B2

CONDENSER MICROPHONE MOUNTABLE ON MAIN PCB

TECHNICAL FIELD

The present invention relates to a condenser microphone, and more particularly to a condenser microphone mountable on a main PCB.

BACKGROUND

In general, manufacturers are focusing their attention on miniaturization of electronic products in order to satisfy consumers' needs since consumers prefer miniaturization of electronic products as well as high performance of the electronic products. In general, an SMT (Surface Mount Technique) is used generally for miniaturizing the electronic products. However, the SMT is not applied to an electronic component having a low critical temperature since a reflow process for an SMD (Surface Mount Device) is performed under high temperature.

Further, since the electronic component has a predetermined thickness even if the SMT is applied thereto, it is necessary that a component mount region of a main PCB is directed toward an inner side of the electronic product when the main PCB is mounted in the electronic product.

Meanwhile, as shown in FIG. 1 and FIG. 2, a sound hole of a conventional condenser microphone is formed on a case of a condenser microphone. Accordingly, in the conventional condenser microphone, it is hard to direct the component mount region of the main PCB toward the inner side. That is, the conventional condenser microphone is inferior in sound quality since a sound wave transfer path is kept apart from a sound source when the component mount region of the main PCB is directed toward the inner side.

FIG. 1 is a perspective view illustrating a condenser microphone mounted on a conventional main PCB and FIG. 2 is a side view illustrating a condenser microphone mounted on the conventional main PCB.

As shown in FIG. 1 and FIG. 2, the sound hole 12a of the conventional condenser microphone 10 is formed on the case 12. The PCB 14 of the conventional condenser microphone 10 is located on the main PCB 20. Contact terminals 14a, 14b of the conventional condenser microphone 10 are adhered on lands of the main PCB 20 by a soldering method. Accordingly, in order to transfer directly the sound wave from the sound source to the conventional condenser microphone 10, it is necessary that the component mount region 20a of the main PCB 20 is directed toward the sound source. In such a case, the space corresponding to thickness d1 of the component should be secured in the electronic product. The reference number 20b indicates an opposite side to the component mount region of the main PCB.

SUMMARY

Accordingly, it is an object of the present invention to provide a condenser microphone mountable on a main PCB for allowing the main PCB to be freely mounted in the electronic product by forming a sound hole on a PCB of a condenser microphone instead of a condenser microphone case, mounting the PCB of the condenser microphone on a main PCB, and forming a through-hole for transferring a sound wave on the main PCB.

In order to achieve the above object, the present invention provides a condenser microphone mountable on a main PCB comprising: a cylinder-shaped case having one side which is opened and the other side which is closed; a first metal ring inserted into the case for an electrical connection; a disk-shaped back plate having a sound hole to be connected electrically to the case through the first metal ring; a ring-shaped spacer; a cylinder-shaped insulating ring having an open top part and an open bottom part to provide an electrical insulation and a mechanical support; a diaphragm inserted into the insulating ring and facing to the back plate while interposing the spacer between the diaphragm and the back plate; a second metal ring for being connected electrically to the diaphragm and supporting mechanically the diaphragm; and a PCB that is mounted with electronic components and is formed with a sound hole, the PCB being connected to the diaphragm and the back plate through the second metal ring and the case, the PCB including connection terminals connected to the outside.

BRIEF DESCRIPTION OF THE DRAWINGS

The above and other objects and features of the invention will become apparent from the following description of preferred embodiments taken in conjunction with the accompanying drawings, in which.

DETAILED DESCRIPTION OF PREFERRED EMBODIMENTS

Reference will now be made in detail to the present invention, examples of which are illustrated in the accompanying drawings. Wherever possible, the same reference numbers will be used throughout the drawings to refer to the same or like parts.

Figure 1:
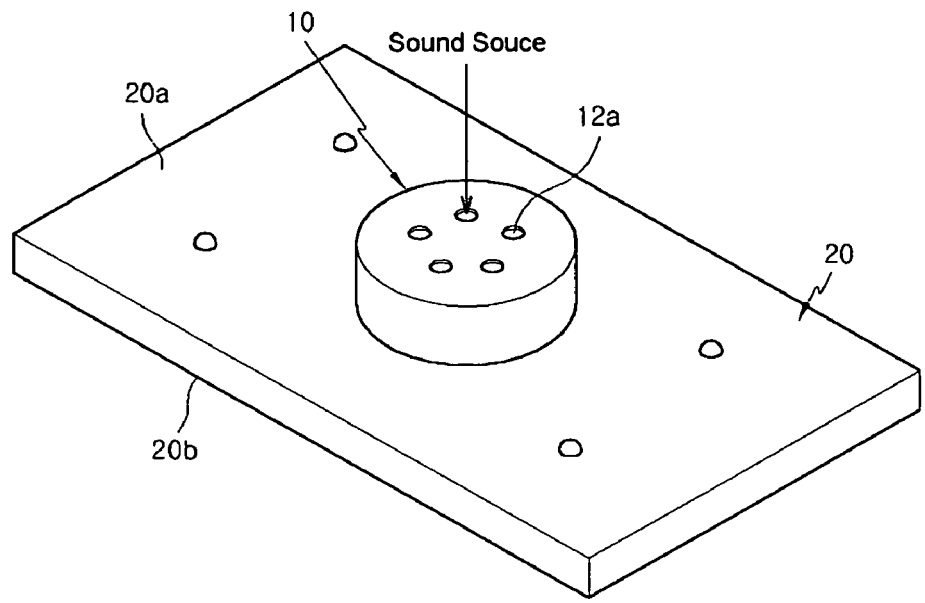
FIG. 1 is a perspective view illustrating a condenser microphone mounted on the conventional main PCB.
Figure 2:
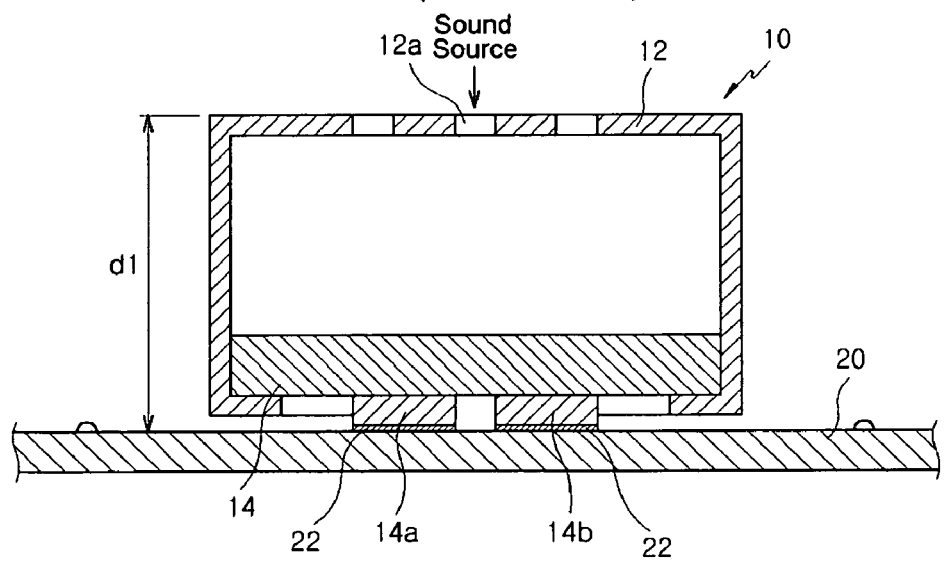
FIG. 2 is a side view illustrating a condenser microphone mounted on the conventional main PCB.
Figure 3:
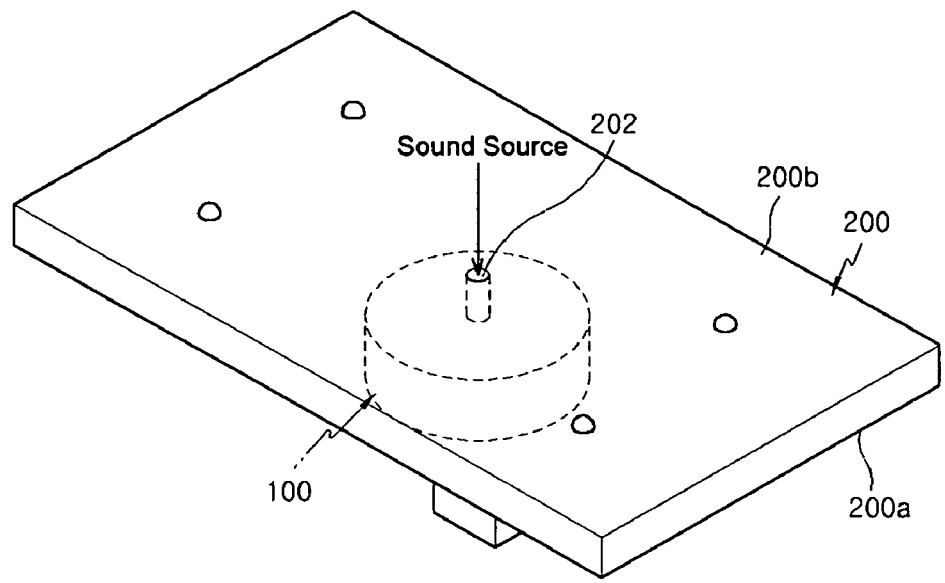
FIG. 3 is a perspective view illustrating a condenser microphone mounted on a main PCB in accordance with the present invention.
Figure 4:
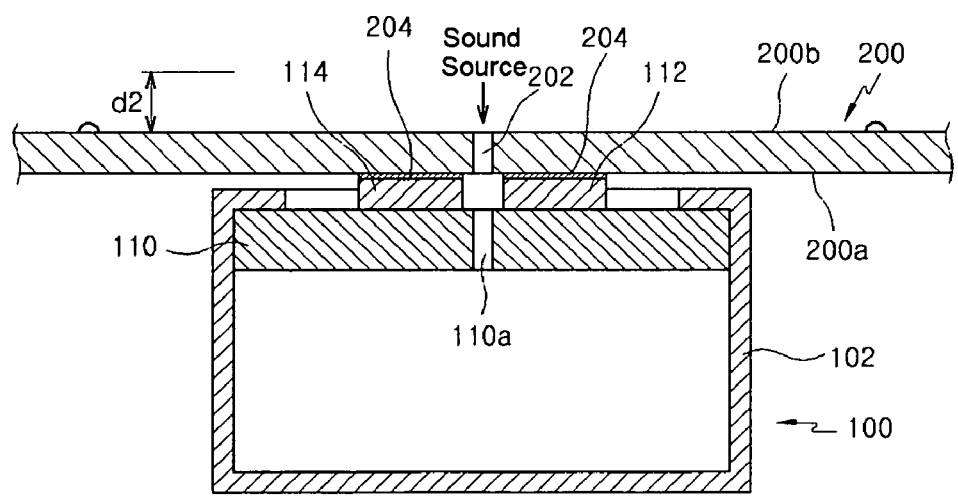
FIG. 4 is a side view illustrating a condenser microphone mounted on a main PCB in accordance with the present invention.

FIG. 3 is a perspective view illustrating a condenser microphone mounted on a main PCB in accordance with the present invention, and FIG. 4 is a side view illustrating a condenser microphone mounted on a main PCB in accordance with the present invention.

Referring to FIG. 3 and FIG. 4, a condenser microphone 100 of the present invention is adhered on a component mount region 200a around a through-hole 202 of a main PCB 200 by a soldering method or an SMD reflow method in order to transfer a sound wave from a sound source to the condenser microphone 100 through the through-hole 202 of the main PCB 200. According to the condenser microphone 100 of the present invention, since the component mount region 200a of the main PCB 200 is directed toward an inner side of an electronic product, the main PCB 200 is mounted on a corresponding electronic product (for examples, a cellular phone or a cassette recorder) in the state of its minimum thickness (d2) regardless of thickness of the mounted component.

To do this, a sound hole 110a is formed on a PCB 110 instead of a case 102 in the condenser microphone 100 of the present invention. The assembled condenser microphone 100 is located and mounted on the component mount region 200a around the through-hole 202 of the main PCB 200 by soldering connection terminals 112,114 to patterns (lands) of the main PCB 200.

The condenser microphone 100 receives the sound wave from the sound source through the through-hole 202 of the main PCB. The sound wave is transferred into an inner space (chamber) through the sound hole 110a of the PCB 110. A diaphragm is vibrated by sound pressure and a gap between the diaphragm and a back plate is varied thereby. At this time, capacitance is varied and the sound wave is converted to an electric signal. Accordingly, in accordance with the present invention, the sound quality is maintained in a good state since a sound wave transfer path is short from the sound source even if the component mount region of the main PCB 200 on which the condenser microphone 100 is mounted is directed toward the inner side as needed.

Figure 5:
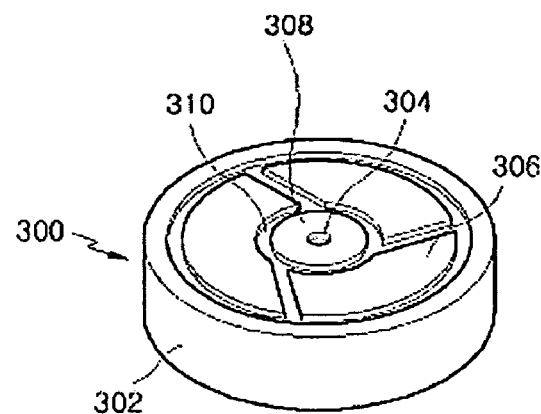
FIG. 5 is an external view illustrating a condenser microphone in accordance with the present invention.

FIG. 5 is an external view illustrating a condenser microphone in accordance with the present invention.

In order to mount the condenser microphone 300 of the present invention having the sound hole formed on the PCB instead of the case on the main PCB 200 by the SMD reflow method, as described in FIG. 5, electric connection electrodes 306,308 of the PCB are projected to the outside in comparison with a curling side of the case 302. The sound hole 304 is formed in a center of the electric connection electrode 308. It is desirable that the electric connection electrodes 306,308 are formed with two inner and outer doughnut-shaped disks. At this time, three exhaust grooves 310 having a gradient from the inside to the outside are formed in the electric connection electrode 306 in order to exhaust the gases in the SMD reflow process.

FIRST EMBODIMENT

Figure 6:
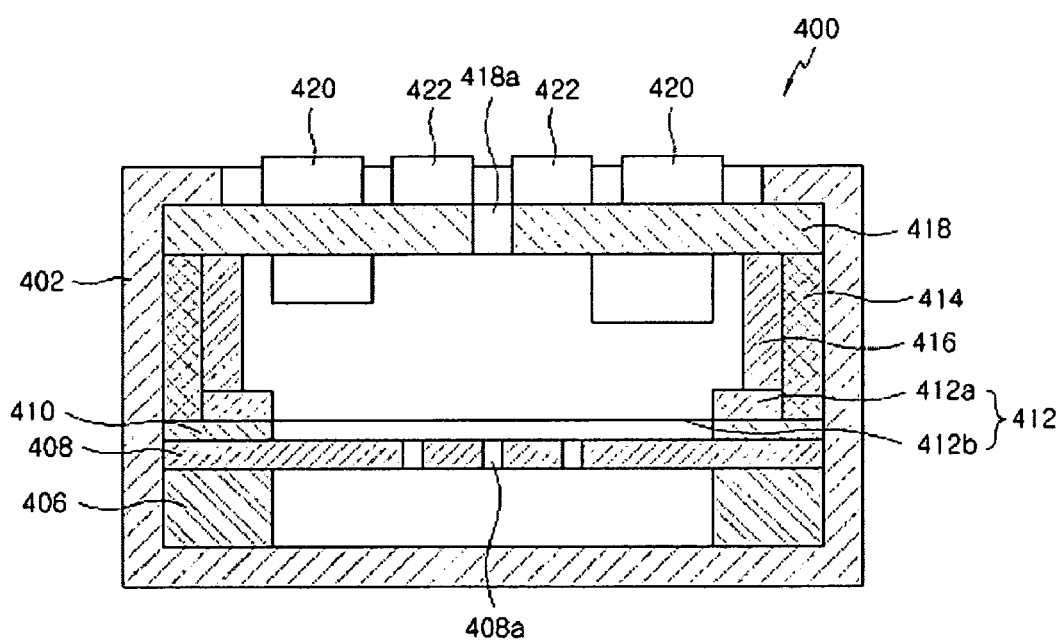
FIG. 6 is a sectional side view illustrating a first preferred embodiment of a condenser microphone in accordance with the present invention.
Figure 7:
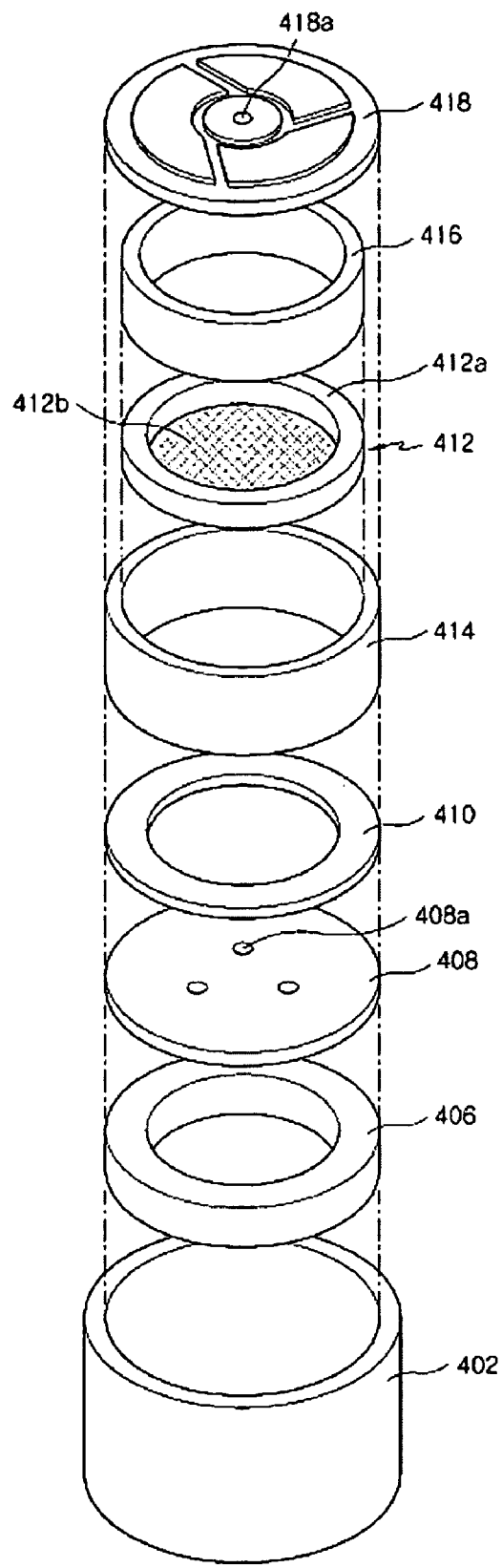
FIG. 7 is an exploded perspective view illustrating a first preferred embodiment of a condenser microphone in accordance with the present invention.

FIG. 6 is a sectional side view illustrating a first preferred embodiment of a condenser microphone in accordance with the present invention, and FIG. 7 is an exploded perspective view illustrating a first preferred embodiment of a condenser microphone in accordance with the present invention.

Referring to FIG. 6 and FIG. 7, the condenser microphone 400 of the present invention comprises a cylinder-shaped case 402 having one side which is opened and the other side which is closed, a first metal ring 406 is inserted into the case 402 to connect electrically to a back plate 408, the disk-shaped back plate 408 having a sound hole 408a, a thin ring-shaped spacer 410, a cylinder-shaped insulating ring 414 having an open top part and an open bottom part to provide an electrical insulating function and a mechanical supporting function, a diaphragm member 412 inserted into the insulating ring 414 and facing to the back plate 408 while interposing the spacer 410 between the diaphragm member 412 and the back plate 408, a second metal ring 416 for connecting electrically the diaphragm member 412 to a PCB 418 and supporting mechanically the diaphragm member 412, and the PCB 418 on which components such as IC and MLCC are mounted and a sound hole 418a is formed. The first metal ring 406, the back plate 408, the spacer 410, the insulating ring 414, the diaphragm member 412, the second metal ring 416, and the PCB 418 are sequentially stacked in the case 402. Then, in order to form one assembly, an open end of the case is curled.

Here, the diaphragm member 412 is formed with a polar ring 412a connected electrically to the PCB 418 and a diaphragm 412b vibrated by the sound pressure. The back plate 408 is formed by thermally adhering an organic film having an electret on a metal plate.

In addition, the condenser microphone 400 is adhered on the main PCB 200 (for example, the PCB of a cellular phone) by the SMD reflow method since connection terminals 420, 422 projected to the outside in comparison with the curled side of the case 402 are formed on an exposed side of the PCB 418. To do this, the connection terminals 420,422 have the same structure as described in FIG. 5. The connection terminals 420,422 are formed with the circular terminal 422 connected to Vdd and the circular ground terminal 420 formed to be partitioned at regular intervals outside the terminal 422.

The operation of the condenser microphone of the present invention will be apparent from the following detailed description.

When the connection terminals 420,422 of the condenser microphone of the present invention are connected to the main PCB 200 and the power is applied to Vdd and GND, the diaphragm 412b is electrically connected to the PCB 418 through the polar ring 412b and the second metal ring 416, and the back plate 408 is electrically connected to the PCB 418 through the first metal ring 406 and the case 402.

In the above state, when a user speaks into the condenser microphone, the sound pressure is applied to the diaphragm 412b through the through-hole 202 of the main PCB 200 and the sound hole 418a of the PCB 418. At this time, the gap between the diaphragm 412b and the back plate 408 is varied by the sound pressure and the capacitance formed by the diaphragm 412b and the back plate 408 is varied thereby. A variation of an electric signal (voltage) is obtained according to the sound wave from the variation of the capacitance. The electric signal is transferred to the IC of the PCB 418 through the above electrical connection line in order to be amplified. The amplified signal is transferred to the main PCB 200 through the connection terminals 420,422.

SECOND EMBODIMENT

Figure 8:
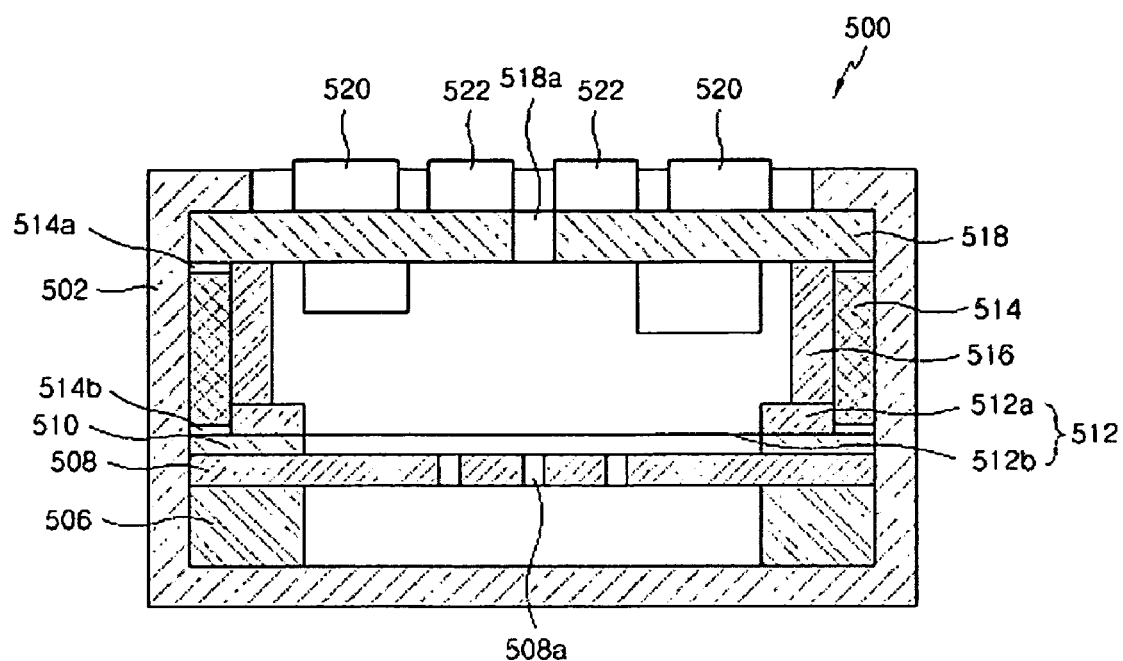
FIG. 8 is a sectional side view illustrating a second preferred embodiment of a condenser microphone in accordance with the present invention.
Figure 9:
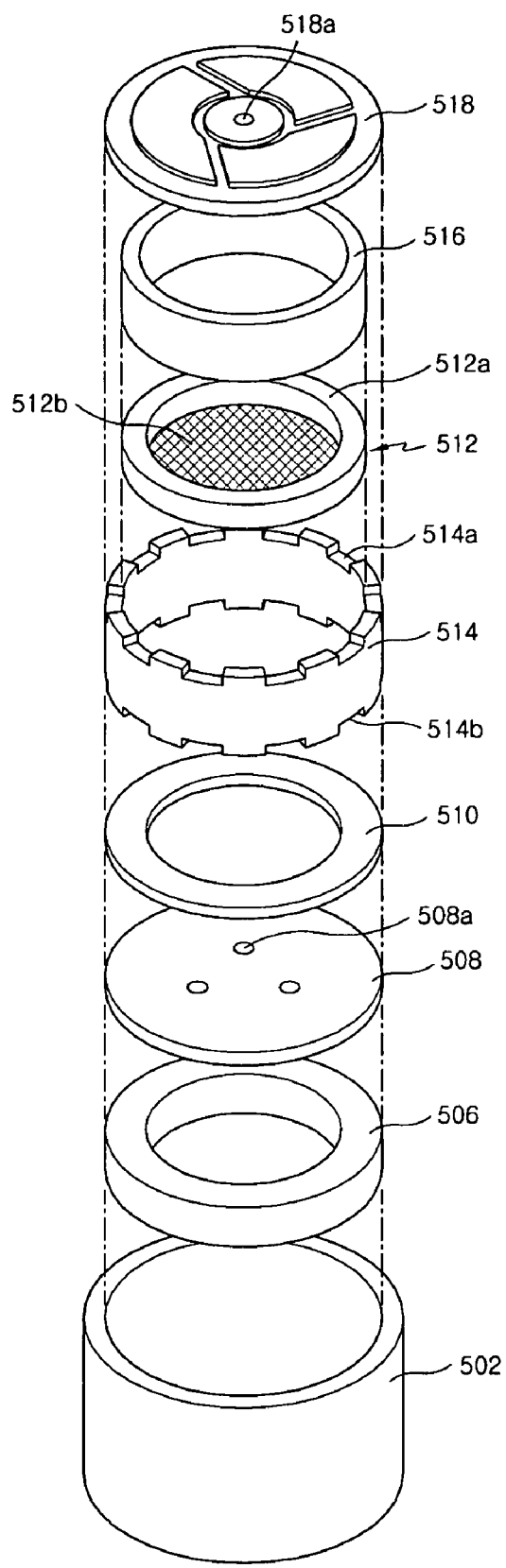
FIG. 9 is an exploded perspective view illustrating a second preferred embodiment of a condenser microphone in accordance with the present invention.

FIG. 8 is a sectional side view illustrating a second preferred embodiment of a condenser microphone in accordance with the present invention, and FIG. 9 is an exploded perspective view illustrating a second preferred embodiment of a condenser microphone in accordance with the present invention.

Referring to FIG. 8 and FIG. 9, the condenser microphone 500 of the present invention includes a cylinder-shaped case 502 having one side which is opened and the other side which is closed, a first metal ring 506 inserted into the case 502 to connect electrically to a back plate 508, the disk-shaped back plate 508 having a sound hole 508a, a thin ring-shaped spacer 510, a cylinder-shaped insulating ring 514 having uneven portions 514a, 514b, an open top part, and an open bottom part to provide an electrical insulating function and a mechanical supporting function, a diaphragm member 512 inserted into the insulating ring 514 and facing to the back plate 408, a second metal ring 516 for connecting electrically the diaphragm member 512 to a PCB 518 and supporting mechanically the diaphragm member 512, and the PCB 518 on which components such as an IC and MLCC are mounted and a sound hole 518a is formed. The first metal ring 506, the back plate 508, the spacer 510, the insulating ring 514, the diaphragm member 512, the second metal ring 516, and the PCB 518 are sequentially stacked in the case 502. Then, in order to form one assembly, an open end of the case is curled.

Here, the diaphragm member 512 is formed with a polar ring 512a connected electrically to the PCB 518 and a diaphragm 512b vibrated by the sound pressure. The back plate 508 is formed by thermally adhering an organic film having an electret on a metal plate.

In addition, the condenser microphone 500 is adhered on the main PCB 200 (for example, the PCB of a cellular phone) by the SMD reflow method since connection terminals 520, 522 projected to the outside in comparison with the curled side of the case 502 are formed on an exposed side of the PCB 518. To do this, the connection terminals are formed with the circular terminal 522 connected to Vdd and the circular ground terminal 520 formed to be partitioned at regular intervals outside the terminal 522.

In order to avoid duplication, the detailed description of the operation of the condenser microphone according to a second preferred embodiment of the present invention will be abbreviated.

As described above, the condenser microphone of the present invention is operated by the sound pressure transferred through the through-hole of the main PCB after the sound hole is formed on the PCB instead of the case of the condenser microphone. Accordingly, the mounting environment of the main PCB is improved largely. Namely, the sound quality is maintained in a good state since the sound wave transfer path is short even if the component mount region of the main PCB on which the condenser microphone of the present invention is mounted is directed toward the inner side of the electronic product as needed.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

The invention claimed is:

1. A condenser microphone mountable on a main PCB, the condenser microphone comprising:
    a cylinder-shaped case having one side which is opened and the other side which is closed;
    a first metal ring inserted into the case for an electrical connection;
    a disk-shaped back plate having a sound hole to be connected electrically to the case through the first metal ring;
    a ring-shaped spacer;
    a cylinder-shaped insulating ring having an open top part and an open bottom part to provide electrical insulation and mechanical support;
    a diaphragm inserted into the insulating ring and facing the back plate while interposing the spacer between the diaphragm and the back plate;
    a second metal ring being connected electrically to the diaphragm and supporting mechanically the diaphragm; and
    a PCB mounted with electronic components and formed with a sound hole, the PCB being connected to the diaphragm and the back plate through the second metal ring and the case, the PCB including connection terminals connected to the outside.

2. The condenser microphone according to claim 1, wherein the connecting terminals includes:
    a first disk-shaped terminal formed on an inside; and
    a second disk-shaped terminal formed to be apart from the first terminal on an outside and having gas exhaust grooves for exhausting gas generated in an adhering process using an SMD reflow method.

3. The condenser microphone according to claim 1, wherein the insulating ring includes uneven portions formed on one end thereof.

4. A condenser microphone mountable on a main PCB, the condenser microphone comprising:
    a cylinder-shaped case having one side which is opened and the other side which is closed, wherein the open side of the cylinder-shaped case has a curled edge projecting inward;
    a first metal ring inserted into the case for an electrical connection;
    a disk-shaped back plate having a sound hole to be connected electrically to the case through the first metal ring;
    a ring-shaped spacer, wherein the disk shaped back plate is interposed between the first metal ring and the disk-shaped back plate;
    a cylinder-shaped insulating ring having an open top part and an open bottom part to provide electrical insulation and mechanical support;
    a diaphragm inserted into the insulating ring and facing the back plate, wherein the spacer is interposed between the diaphragm and the back plate and the diaphragm is disposed over the back plate so as to be between the back plate and the open side of the cylinder-shaped case;
    a second metal ring being connected electrically to the diaphragm and supporting mechanically the diaphragm; and
    a PCB mounted with electronic components and formed with a sound hole, the PCB being connected to the diaphragm and the back plate through the second metal ring and the case, the PCB being interposed between the inwardly projecting curled edge and both the second metal ring and the insulating ring, the PCB including connection terminals projecting from the PCB towards the open side of the cylinder-shaped case.

5. The condenser microphone according to claim 4, wherein the connecting terminals includes:
    a first disk-shaped terminal formed on an inside; and
    a second disk-shaped terminal formed to be apart from the first terminal on an outside and having gas exhaust grooves for exhausting gas generated in an adhering process using an SMD reflow method.

6. The condenser microphone according to claim 4, wherein the insulating ring includes uneven portions formed on one end thereof.

* * * * *